United States Patent
Nishioka et al.

(10) Patent No.: US 8,901,431 B2
(45) Date of Patent: Dec. 2, 2014

(54) PRINTED WIRING BOARD AND METHOD FOR MANUFACTURING PRINTED WIRING BOARD

(75) Inventors: Hiroyuki Nishioka, Ogaki (JP); Ryojiro Tominaga, Ogaki (JP); Tatsuya Imai, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 104 days.

(21) Appl. No.: 13/307,499

(22) Filed: Nov. 30, 2011

(65) Prior Publication Data

US 2012/0152600 A1    Jun. 21, 2012

Related U.S. Application Data (60) Provisional application No. 61/423,727, filed on Dec. 16, 2010.

(51) Int. Cl.
*H05K 1/03* (2006.01)
*H05K 3/40* (2006.01)
*H05K 3/34* (2006.01)

(52) U.S. Cl.
CPC ........ *H05K 3/4007* (2013.01); *H05K 2201/099* (2013.01); *H05K 2203/0594* (2013.01); *H05K 3/3484* (2013.01); *H05K 3/3452* (2013.01)
USPC ........................................................ 174/255

(58) Field of Classification Search
CPC ..... H05K 1/111; H05K 1/115; H05K 3/3452; H05K 2201/099; H05K 3/429; H05K 3/4603; H05K 3/3484; H05K 2203/0594
See application file for complete search history.

(56) References Cited

U.S. PATENT DOCUMENTS

| 7,126,211 | B2 * | 10/2006 | Yang | 257/678 |
| 7,250,362 | B2 * | 7/2007 | Huang | 438/612 |
| 7,390,974 | B2 * | 6/2008 | Shirai et al. | 174/263 |
| 7,449,406 | B2 * | 11/2008 | Nishiyama et al. | 438/612 |
| 2008/0041615 | A1 * | 2/2008 | Zhong et al. | 174/255 |
| 2010/0071950 | A1 * | 3/2010 | Ohsumi | 174/261 |
| 2010/0122839 | A1 * | 5/2010 | Akai et al. | 174/257 |
| 2011/0100696 | A1 * | 5/2011 | Nagamatsu et al. | 174/261 |

FOREIGN PATENT DOCUMENTS

| EP | 1 848 257 A1 | 10/2007 |
| EP | 2 209 358 A1 | 7/2010 |
| JP | 2002-290022 | 10/2002 |
| JP | 2004-327743 | 11/2004 |
| JP | 2009-239319 | 10/2009 |
| JP | 2010-109308 | 5/2010 |
| WO | WO 2006/082784 A1 | 8/2006 |
| WO | WO 2010/038532 A1 | 4/2010 |

* cited by examiner

*Primary Examiner* — Ishwarbhai B Patel
(74) *Attorney, Agent, or Firm* — Oblon, Spivak, McClelland, Maier & Neustadt, L.L.P.

(57) ABSTRACT

A printed wiring board including an interlayer resin insulation layer, a pad formed on the interlayer resin insulation layer and for mounting an electronic component, a solder-resist layer formed on the interlayer resin insulation layer and the pad and having an opening portion over the pad, and a coating layer formed on the pad and exposed through the opening portion of the solder-resist layer. The solder-resist layer has a protruding portion protruding toward the inside of the opening portion in a bottom portion of the opening portion, and the protruding portion of the solder-resist layer has a flat surface in an end portion of the protruding portion.

20 Claims, 8 Drawing Sheets

PRINTED WIRING BOARD AND METHOD FOR MANUFACTURING PRINTED WIRING BOARD

CROSS-REFERENCE TO RELATED APPLICATIONS

The present application is based on and claims the benefit of priority to U.S. application Ser. No. 61/423,727, filed Dec. 16, 2010, the entire contents of which are incorporated herein by reference.

BACKGROUND OF THE INVENTION

1. Field of the Invention

The present invention relates to a printed wiring board and a method for manufacturing a printed wiring board.

2. Discussion of the Background

In recent years, the structures of the wiring and pads of a semiconductor element have become finer, and the pitch of bumps in a printed wiring board on which the semiconductor element is mounted has also become finer. As a result, opening portions formed in solder-resist layers are becoming smaller. In particular, the diameter of opening portions is made extremely small. As a printed wiring board, a printed wiring board is suggested where pads for mounting an electronic component are formed on an interlayer resin insulation layer while a solder-resist layer is formed as an outermost layer. Opening portions are formed in the solder-resist layer to expose the pads, and solder bumps are formed in the opening portions (for example, see WO 2006/082784). The contents of this publication are incorporated herein by reference in their entirety.

SUMMARY OF THE INVENTION

According to one aspect of the present invention, a printed wiring board includes an interlayer resin insulation layer, a pad formed on the interlayer resin insulation layer and for mounting an electronic component, a solder-resist layer formed on the interlayer resin insulation layer and the pad and having an opening portion over the pad, and a coating layer formed on the pad and exposed through the opening portion of the solder-resist layer. The solder-resist layer has a protruding portion protruding toward the inside of the opening portion in a bottom portion of the opening portion, and the protruding portion of the solder-resist layer has a flat surface in an end portion of the protruding portion.

According to another aspect of the present invention, a method for manufacturing a printed wiring board includes preparing an interlayer resin insulation layer, forming on the interlayer resin insulation layer a pad for mounting an electronic component, forming a solder-resist layer on the interlayer resin insulation layer and the pad, forming an opening portion in the solder-resist layer such that at least a portion of the pad is exposed, and forming a coating layer on the portion of the pad exposed through the opening portion. The forming of the opening portion of the solder-resist layer includes forming in the solder-resist layer a protruding portion protruding toward the inside of the opening portion in a bottom portion of the opening portion such that the protruding portion of the solder-resist layer has a flat surface in an end portion of the protruding portion.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

The embodiments will now be described with reference to the accompanying drawings, wherein like reference numerals designate corresponding or identical elements throughout the various drawings.

Figure 1:
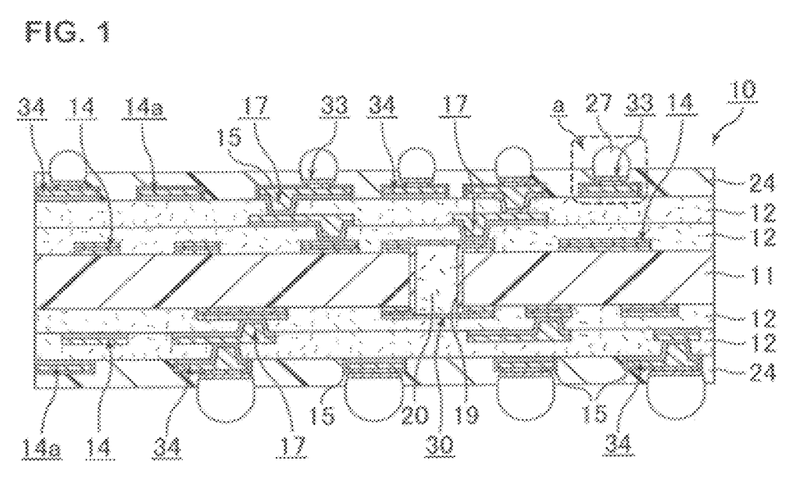
FIG. 1 is a cross-sectional view schematically showing a printed wiring board according to an embodiment.

FIG. 1 is a cross-sectional view schematically showing a printed wiring board according to an embodiment. In printed wiring board 10 of the embodiment shown in FIG. 1, conductive circuits 14 and interlayer resin insulation layer 12 are alternately formed on both surfaces of insulative substrate 11, and conductive circuits 14 formed on surfaces of insulative substrate 11 are electrically connected by through-hole conductors 19. In addition, conductive circuits 14 sandwiching interlayer resin insulation layer 12 are electrically connected by via conductors 17. Also, along with conductive circuits 14, solder pads 34 formed as pads for mounting electronic components are formed on the outermost interlayer resin insulation layers. Solder pads 34 and outermost conductive circuits (14a) have the same structure. Resin-filler layer 20 is formed in through-hole conductors 19, and conductive circuits 30 are formed to cover resin-filler layer 20. Solder-resist layers 24 are formed as outermost layers of the printed wiring board. With coating layer 33 formed in between, solder bumps 27 are formed on solder pads 34 positioned at the bottoms of opening portions formed in solder-resist layers 24. Coating layer 33 is made of an Ni layer formed on solder pads 34 and an Au layer formed on the Ni layer.

Figure 2A:
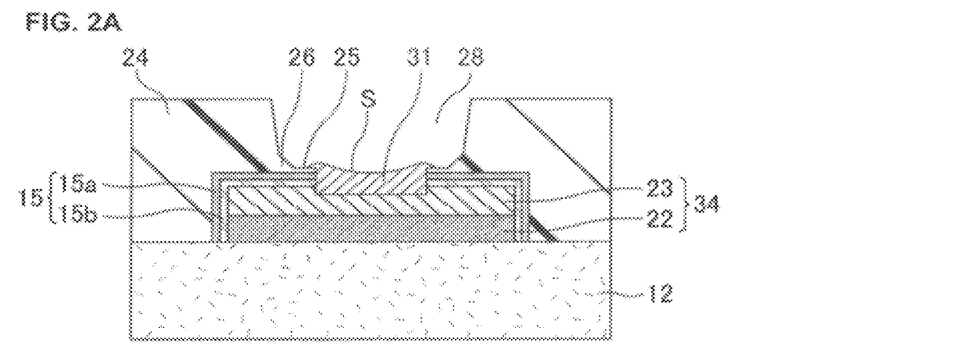
FIG. 2A is a partially magnified cross-sectional view schematically showing region "a" of the printed wiring board shown in FIG. 1.

FIG. 2A is a partially magnified cross-sectional view schematically showing region "a" of the printed wiring board shown in FIG. 1. In FIG. 2A, a solder bump and the Au layer of the coating layer are omitted, and only Ni layer 31 of the coating layer is shown. In the structure shown in FIG. 2A, solder-resist layer 24, opening portion 28, protruding portion 26 and flat surface 25 are described in the following.

In FIG. 2A, opening portion 28 is formed on solder pad 34 in solder resist layer 24. A coating layer (Ni layer 31 in FIG. 2A) is formed on solder pad 34 that corresponds to the portion exposed through opening portion 28. Solder-resist layer 24 has protruding portion 26 which is shaped to protrude at the bottom of opening portion 28 toward the inside of opening portion 28. Protruding portion 26 has flat surface 25 at its end.

Figure 2B:
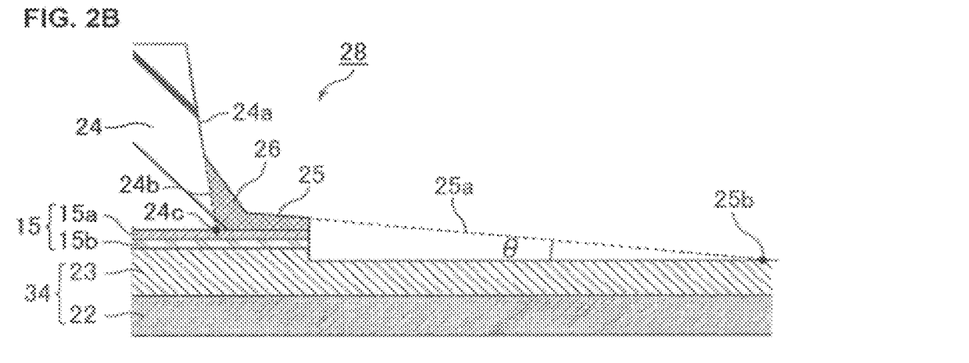
FIG. 2B is a cross-sectional view schematically showing a protruding portion and a flat surface.

FIG. 2B is a cross-sectional view schematically showing the protruding portion and its flat surface. Ni layer 31 shown in FIG. 2A is omitted in FIG. 2B. Protruding portion 26 is defined as the portion which protrudes toward the inside of opening portion 28 from point of intersection (24c) where extended line (24b) of line (24a), which is extended in the direction in which solder-resist layer 24 drops substantially vertically from the upper surface of opening portion 28, intersects the layer (adhesive layer 15) positioned beneath solder-resist layer 24.

Flat surface 25 is a flat surface formed at the end of protruding portion 26. Here, a flat surface is defined as such a surface where angle θ is 30 degrees or less at point of intersection (25b) where extended line (tangent) (25a), which is drawn from any point on flat surface 25 toward the inside of opening portion 28, intersects solder pad 34. Angle θ is more preferably 15 degrees or less. If flat surface 25 and the surface of solder pad 34 are substantially parallel, angle θ is not set. However, the "flat surface" includes such a situation. Moreover, if the end of protruding portion 26 is higher than its originating portion, then the angle is set by drawing extended line (25a) in the opposite direction, namely, toward the outside of opening portion 28. If such an angle is 30 degrees or less, the surface is also defined as a "flat surface."

Figure 2C:
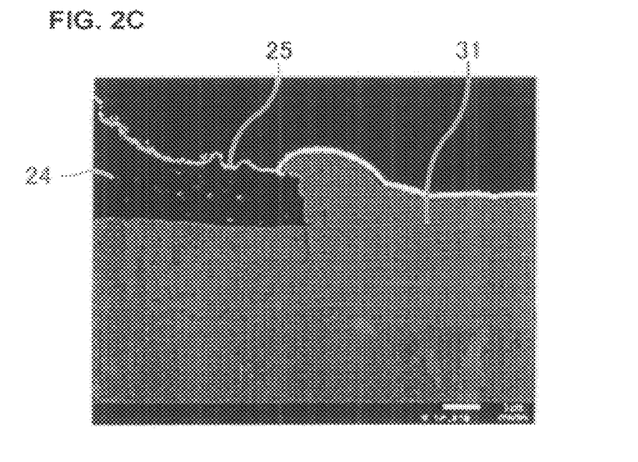
FIG. 2C is a photograph of a cross section observed in the surroundings of a protruding portion in a printed wiring board according to an embodiment of the present invention.

FIG. 2C is a photograph of a cross section observed in the surroundings of a protruding portion in a printed wiring board according to an embodiment of the present invention. FIG. 2C shows a situation in which part of flat surface 25 is covered with Ni layer 31 at the end of protruding portion 26 in solder-resist layer 24. In other words, it shows a situation in which part of flat surface 25 is embedded under Ni layer 31. From FIG. 2C, it is found that a recess is hardly formed because of the end of the protruding portion and the coating layer. Namely, if a bump is formed in such an opening portion, voids are prevented from remaining at the bottom of the bump.

The material used for the solder-resist layer in the present embodiment is of a type that contains inorganic filler with an average particle diameter of 1 μm or smaller at 5~25 wt. % and that does not contain organic filler. It is preferred that there should be no inorganic filler with a particle diameter exceeding 3 μm in the solder-resist layer. Also, the thickness of the solder resist layer is 10~20 μm, and the diameter (maximum diameter) of opening portions is 45~60 μm.

The rest of the structure in the structure shown in FIG. 2A is described as follows. Adhesive layer 15 is formed on side surfaces and part of the top surface of solder pad 34. Adhesive layer 15 is made of first layer (15a) which is a metal layer containing Sn and of second layer (15b) which is formed on the first layer and is made of a silane coupling agent. Namely, solder pad 34 and solder-resist layer 24 are adhered with adhesive layer 15 formed in between.

Adhesive layer 15 is also formed on the side and top surfaces of outermost conductive circuit (14a) having the same structure as that of solder pad 34. On an outermost conductive circuit that does not form a solder pad (conductive circuit where no solder pad is formed), adhesive layer 15 is formed on its entire surface (top and side surfaces) excluding the surface in contact with the interlayer resin insulation layer (lower surface).

Also, as shown in FIG. 2A, solder pad 34 is made of electroless copper-plated film 22 and electrolytic copper-plated film 23 formed on electroless copper-plated film 22. Moreover, adhesive layer 15 is formed between solder pad 34 and solder-resist layer 24. Namely, adhesive layer 15 is not present on a portion of solder pad 34 which is to be exposed through opening portion 28 (the portion where Ni film 31 is formed). In the present application, the top surface of solder pad 34 and the top surface of outermost conductive circuit (14a) indicate the surfaces on the side where a solder-resist layer is formed.

As described above, if a first layer made of a metal containing Sn is formed on predetermined portions of the top and side surfaces of solder pad 34, and a second layer made of a silane coupling agent is formed on the first layer, then solder pad 34 and solder-resist layer 24 are firmly adhered by the first and second layers (adhesive layer 15). A further description about that is provided below.

In printed wiring board 10 shown in FIGS. 1 and 2A, the first layer formed on the surface of solder pad 34 and made of a metal layer containing Sn is a metal layer in which Sn and Cu are both present. More specifically, the metal layer contains $Cu_6Sn_5$ and $Cu_3Sn$. In addition, when the metal layer is formed, it is thought that a hydroxyl group is attached to its surface. Especially, if Sn is contained, a hydroxyl group tends to be attached. As described, if a hydroxyl group is attached to the surface of a metal layer, it easily reacts with a silane coupling agent through a dehydration reaction, resulting in a firm bond between the first layer made of a metal layer containing Sn and the second layer made of a silane coupling agent. Furthermore, the silane coupling agent reacts with the resin ingredient of solder-resist layer 24 to be chemically bonded. Thus, the second layer and solder-resist layer 24 are bonded firmly. As a result, solder pad 34 and solder-resist layer 24 are bonded firmly by the first layer and second layer.

Since solder pad 34 and solder-resist layer 24 are firmly adhered, the surface of solder pad 34 is not required to be roughened. In printed wiring board 10, the surface roughness (Ra) of solder pad 34 is 0.3 μm or less. The surface roughness (Ra) of solder pad 34 is more preferably 0.15 μm or less. To measure the Ra values, a conventionally known method may be used; for example, a non-contact surface profiler (such as WYKO NT3300 made by Veeco Instruments) may be used.

In addition, the top surface of solder pad 34 and the entire coating layer 33 are in direct contact in printed wiring board 10. Namely, a metal layer containing Sn is not present between solder pad 34 and coating layer 33. Therefore, since there is no concern of an increase in electrical resistance between solder pad 34 and a bump, a decrease in signal characteristics and loss in voltage supply to a semiconductor element are suppressed. Also, coating layer 33 has surface "S" where the central portion is recessed from its periphery (see FIG. 2A). Accordingly, when a solder ball is loaded in the opening portion during the process of forming a bump, coating layer 33 makes it easy to align the ball. Although FIG. 2A shows only Ni layer 31 as a coating layer, the shape of the coating layer is the same as that of coating layer 33 where an Au layer is formed on Ni layer 31.

A method for manufacturing a printed wiring board of the embodiment is described according to the order of its process.

(1) An insulative substrate is prepared for a starting material, and conductive circuits are formed on the insulative substrate. The insulative substrate is not limited to any specific kind, and the following may be used: resin substrates such as glass-epoxy substrate, bismaleimide-triazine (BT) resin substrate, copper-clad laminate and RCC substrate; ceramic substrates such as aluminum nitride substrate; silicon substrates; and the like. Conductive circuits are formed, for example, by forming plain copper conductive layers on the surfaces of the insulative substrate through electroless copper plating and electrolytic copper plating and then by performing etching. In this step, through-hole conductors may also be formed to connect conductive circuits sandwiching the insulative substrate. In addition, after conductive circuits are formed, the surfaces of the conductive circuits may be roughened through etching if required.

(2) Next, interlayer resin insulation layers are formed on the insulative substrate where conductive circuits have been formed. Opening portions reaching the conductive circuits are formed in interlayer resin insulation layers. The interlayer resin insulation layers are formed using thermosetting resin, photosensitive resin, thermosetting resin into which a photosensitive group is introduced, resin composite material containing such resin and thermoplastic resin, or the like. In particular, resin layers are formed by applying uncured resin using a roll coater, curtain coater and the like, or by thermal pressing resin film. After that, the resin is cured if required, and opening portions are formed through a laser process or exposure and development. Also, if thermoplastic resin is used, resin layers are formed by thermal pressing film-type resin material.

(3) Next, electroless copper-plated film is formed on the surfaces of the interlayer resin insulation layers (including wall surfaces of the opening portions). Here, the thickness of electroless copper-plated film is preferred to be 0.1~0.3 µm.

(4) Next, plating resist is formed on the electroless copper-plated film. The plating resist is formed on portions where conductive circuits and via conductors are not formed. The method for forming the plating resist is not limited specifically; for example, it may be formed by laminating photosensitive dry film and processing through exposure and development.

(5) Next, electrolytic copper-plated film is formed on portions of the electroless copper-plated film where the plating resist is not formed. Here, the thickness of electrolytic copper-plated film is preferred to be 5~20 µm.

(6) Then, the plating resist on the interlayer resin insulation layers is removed. The plating resist may be removed by using, for example, an alkaline solution or the like.

(7) Next, the electroless copper-plated film exposed by removing the plating resist is removed. Here, the electroless copper-plated film may be removed by, for example, using an etching solution. Unnecessary electroless copper-plated film (electroless copper-plated film existing between portions of electrolytic plated film) is completely removed.

By above steps (2) through (7), conductive circuits are formed on the interlayer resin insulation layers, while via conductors connecting such conductive circuits and the conductive circuits on the insulative substrate are simultaneously formed. Accordingly, conductive circuits and via conductors are efficiently formed. Also, if necessary, the catalyst on the interlayer resin insulation layers may be removed using acid or oxidation agents after the conductive circuits are formed. Electrical characteristics are prevented from being lowered.

(8) Moreover, depending on requirements, above steps (2) through (7) are repeated to further form interlayer resin insulation layers and conductive circuits, while simultaneously forming via conductors.

Among the conductive circuits formed through the above procedures, part or all of the outermost conductive circuits become solder pads. Therefore, by forming outermost conductive circuits, solder pads are formed at the same time.

(9) Next, a first layer made of a metal layer containing Sn is formed on the entire exposed surface of solder pads (side and top surfaces). To form the first layer made of a metal layer containing Sn, for example, tin displacement plating, electroless tin plating, electrolytic tin plating, fused tin immersion plating or the like may be listed. Among those, tin displacement plating is preferred because the thickness of plated film is easy to control. A mixed solution of tin fluoroborate and thiourea, for example, may be used as a plating solution for such tin displacement plating. When tin displacement plating is performed on solder pads made of copper, a layer containing Sn (hereinafter referred to as an Sn layer), and a layer containing Sn and Cu (hereinafter referred to as an SnCu layer) are formed in that order from the surface-side of solder pads. If required, when the first layer is formed using the above method, the Sn layer may be removed by etching so that the SnCu layer is exposed. The SnCu layer obtained accordingly forms the first layer. The step for removing the Sn layer is optional.

A hydroxyl group is attached to the surface of the first layer formed as above. The reasons for a hydroxyl group to be easily attached to the first layer made of a metal layer containing Sn have been described above. Also, the hydroxyl group is attached without performing any specific treatment, since water molecules are adsorbed onto the first layer surface. Alternatively, a specific treatment may be performed so that a hydroxyl group is attached to the first-layer surface. For example, a method for treating a solder-pad surface using a metal alkoxide is listed as a first method for attaching a hydroxyl group on the first-layer surface. As a metal alkoxide, sodium methoxide ($CH_3ONa$), sodium ethoxide ($C_2H_5ONa$), lithium ethoxide ($C_2H_5OLi$) and the like are listed. A hydroxyl group is attached by immersing the printed wiring board in such a metal alkoxide solution, by spraying such a solution on the solder-pad surface or the like. In addition, a method for treating surfaces of the conductive circuits by alkali, for example, may be listed as a second method. Sodium hydroxide, potassium hydroxide, sodium methoxide and the like are listed as alkali, for example. A hydroxyl group is attached by immersing the printed wiring board in such an alkaline solution, by spraying the alkaline solution on solder-pad surfaces, or the like. Moreover, moisture soaking or vapor phase soldering, for example, may also be employed on solder pads as a third method. In this step, the first layer is formed on all the outermost conductive circuits including solder pads.

(10) Next, a second layer made of a silane coupling agent is formed on the first layer. Here, to form the second layer, a solution containing a silane coupling agent, for example, is sprayed and dried. The combination of a later-described solder-resist layer and a silane coupling agent is preferred to be selected so that a functional group in the solder-resist layer and the functional group in the silane coupling agent chemically react when heated. For example, if an epoxy group is included in the solder-resist layer, by selecting an amino functional silane as the silane coupling agent, remarkable adhesiveness is achieved between them. Without being bound by the theory, that is thought to be because the epoxy group and the amino group easily form a firm chemical bond by the heat added while the solder-resist layer is formed, and such a bond is extremely stable against heat and water.

(11) Next, solder-resist layers are formed on outermost resin insulation layers and on solder pads, while opening portions for forming solder bumps are formed in the solder-resist layers. In particular, using a roll-coater method or the like, a solder-resist composition is applied on the outermost interlayer resin insulation layers including the conductive circuits, openings are formed through a laser process or exposure and development or the like, and then a curing process is performed. Accordingly, solder-resist layers are formed having opening portions at predetermined spots. A composition which contains inorganic filler with an average particle diameter of 1 μm or smaller at 5~25 wt. % and which does not contain organic filler is used as the solder-resist composition. Furthermore, the surface roughness (Ra) of solder pads 34 is 0.3 μm or less. Thus, when opening portions are formed through exposure and development, the irradiated light rays reflected at pad surfaces are not offset each other and most of the light contributes to curing the solder-resist composition. As a result, protruding portions having the above-described shape are formed.

(12) Next, solder pads are exposed at the bottoms of the opening portions in the solder-resist layers formed in above step (11). When above step (11) is finished, the first layer is usually exposed at the bottoms of the opening portions. Such first layer is removed using an etching solution made from a nitric acid solution and a hydrogen peroxide solution, or using a wet blasting method. Moreover, when solder pads are exposed at the bottoms of opening portions in the solder-resist layers using such methods, desmearing may also be conducted simultaneously to remove resin residue remaining in the opening portions formed in solder-resist layers while the second layer and the first layer are being removed.

In addition, when opening portions are formed in solder-resist layers through a laser process or exposure and development or the like, and/or when the first layer is removed by a method using an etching solution, a wet blasting method or the like, the second layer on the first layer is also removed.

At the bottoms of the opening portions in the solder-resist layers formed through the above procedure, protruding portions are formed to protrude toward the inside of the opening portions and to have flat surfaces at their ends.

(13) Next, a coating layer is formed on solder pads exposed at the bottoms of the opening portions in the solder-resist layers. In particular, first, an Ni layer is formed on solder pads by electroless nickel plating, and an Au layer is formed on the Ni layer by electroless gold plating. Accordingly, a coating layer made of an Ni layer and an Au layer is formed. The coating layer is formed to cover at least part of a flat surface while at least part of the flat surface is embedded under the coating layer.

(14) Lastly, solder bumps are formed and a printed wiring board is completed. More specifically, solder bumps are formed by loading solder balls on the opening portions of the solder-resist layers and by conducting a reflow at a predetermined temperature.

Effects of a printed wiring board and a method for manufacturing a printed wiring board in the embodiment are listed as follows.

(1) In a printed wiring board according to the embodiment, a solder-resist layer has a protruding portion that is shaped to protrude at the bottom of an opening portion toward the inside of the opening portion, and the protruding portion has a flat surface at its end. Accordingly, such a protruding portion and a coating layer suppress a recess from being formed. In addition, since voids seldom remain when a bump is formed in the opening portion, the adhesiveness and reliability of the bump are enhanced.

(2) In a printed wiring board according to the embodiment, at least part of a flat surface is covered with the coating layer, and at least part of the flat surface is embedded under the coating layer. Accordingly, the end of a protruding portion in the solder-resist layer is vertically sandwiched by the coating layer and a pad. Therefore, the adhesiveness of the solder-resist layer (protruding portion) to the pad is improved.

(3) In a printed wiring board according to the embodiment, the diameter of an opening portion is set to be 45~60 μm. When the diameter of an opening portion is formed in such a small value, voids tend to occur at the bottom of a bump if there is a recess at the bottom of the opening portion. Therefore, forming a flat surface is especially effective.

(4) In a printed wiring board according to the embodiment, the surface roughness (Ra) of the surface of a solder pad is set at 0.3 μm or less. If the surface roughness is set at such a low range, a flat surface tends to be formed at the end of a protruding portion when a solder-resist layer is formed. Also, when a signal with a high frequency that exceeds 1 GHz is transmitted, transmission loss is prevented from increasing due to the skin effect.

(5) In a printed wiring board according to the embodiment, since there is an adhesive layer made of a first layer containing Sn and Cu and a second layer made of a silane coupling agent between a solder pad and a solder-resist layer, adhesiveness is enhanced between the pad and the solder-resist layer.

(6) In a printed wiring board according to the embodiment, a solder pad is made of electroless copper-plated film and electrolytic copper-plated film, and a coating layer is directly formed on the surface of the electrolytic copper-plated film of the solder pad. Such a structure ensures adhesiveness between the coating layer and the solder pad while there is no concern about electric resistance increasing between solder bumps.

(7) As for solder-resist layers, a material is used which contains inorganic filler with an average particle diameter of 1 μm or smaller at 5~25 wt. % but does not contain organic filler. Also, in such a material for solder-resist layers, it is preferred that inorganic filler having particles with a diameter of 3 μm or greater not be present. If the particle diameter of a filler is fine and the amount of the filler is small, there are fewer obstacles during exposure to light and that effects of the light reflected at pads tend to be greater. When an opening portion is formed in such a solder-resist layer through exposure and development, a flat surface is formed at the end of a protruding portion.

In the following, the embodiment is further described citing examples. The embodiment of the present invention is not limited to such examples.

EXAMPLE (A) Preparing Resin Filler

To prepare a resin filler having a viscosity of 45~49 Pa·s at 23±1° C., the following were put in a container and blended: 100 weight parts of bisphenol F-type epoxy monomer (molecular weight 310, YL 983U made by Yuka Shell); 170 weight parts of $SiO_2$ spherical particles whose surfaces are covered with a silane coupling agent, whose average particle diameter is 1.6 μm and whose maximum particle diameter is 15 μm or smaller (CRS 1101-CE made by Admatechs); and 1.5 weight parts of a leveling agent (Perenol S4 made by San Nopco). Also, 6.5 weight parts of imidazole curing agent (2E4MZ-CN made by Shikoku Chemicals) were used as a curing agent.

Figure 3A:
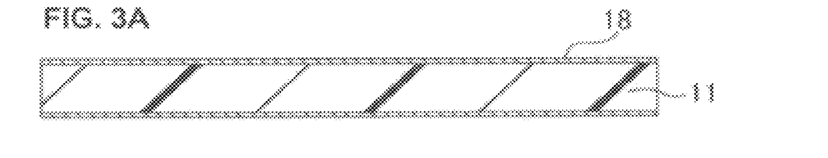
FIG. 3A, FIG. 3B, FIG. 3C, FIG. 3D, FIG. 3E, FIG. 3F and FIG. 3G are cross-sectional views schematically showing a method for manufacturing a printed wiring board according to the embodiment.
Figure 3B:
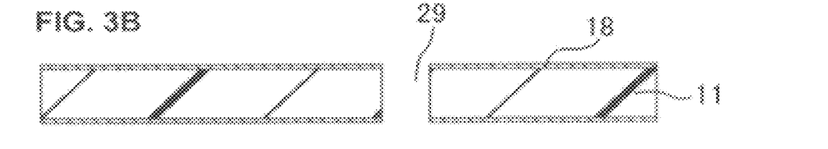

(B) Manufacturing a Printed Wiring Board (1) As shown in FIG. 3A, a copper-clad laminate, where 18 μm-thick copper foil 18 is laminated on both surfaces of insulative substrate 11 made of 0.8 mm-thick glass-epoxy resin, was used as a starting material. Next, as shown in FIG. 3B, the copper-clad laminate was drilled to make holes, and penetrating holes 29 for through-hole conductors were formed.

Figure 3C:
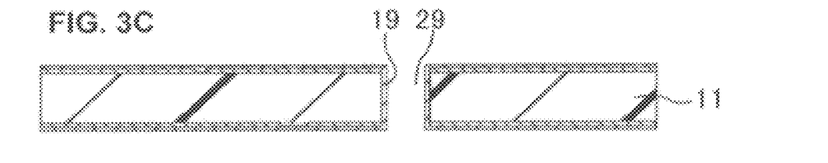

Next, as shown in FIG. 3C, electroless copper plating and electrolytic copper plating were performed on copper foils 18 and on the inner-wall surfaces of penetrating holes 29. Accordingly, conductive layers including through-hole conductors 19 were formed, being made of electroless copper-plated film and electrolytic copper-plated film on the electroless copper-plated film.

(2) Next, the substrate with through-hole conductors 19 was washed with water and dried. Then, a black-oxide treatment was performed using a solution containing NaOH (10 g/L), $NaClO_2$ (40 g/L) and $Na_3PO_4$ (6 g/L) as a black-oxide bath (oxidation bath), and a reduction treatment was performed using a solution containing NaOH (10 g/L) and $NaBH_4$ (6 g/L) as a reduction bath. Accordingly, the surfaces of through-hole conductors 19 were roughened (not shown in the drawings).

Figure 3D:
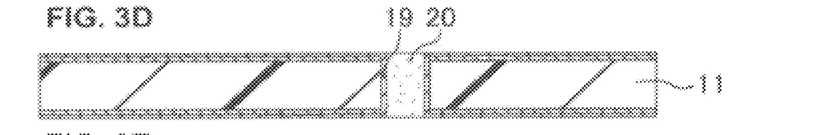

(3) Next, as shown in FIG. 3D, the resin filler described in above (A) was filled inside through-hole conductors 19 using the following method.

Namely, first, the resin filler was squeezed into through-hole conductors 19 using a squeegee, and was dried under the conditions of 100° C. for 20 minutes. Then, one surface of the substrate was belt sanded using a #600 belt-sander polishing paper (made by Sankyo Rikagaku) so that the resin filler would not remain on the electrolytic copper-plated film. Then, buff polishing was performed to remove scratches from the belt sanding. Such a series of polishings was performed on the other surface of the substrate. Next, the substrate was heated at 100° C. for an hour, at 120° C. for three hours, at 150° C. for an hour and at 180° C. for seven hours to form resin filler layer 20.

Figure 3E:
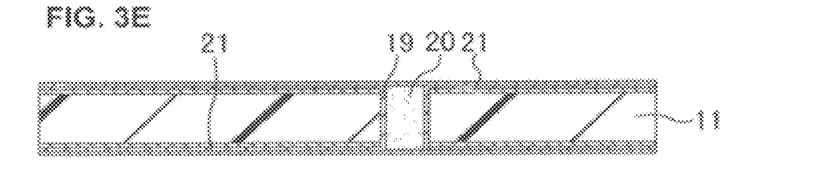
Figure 3F:
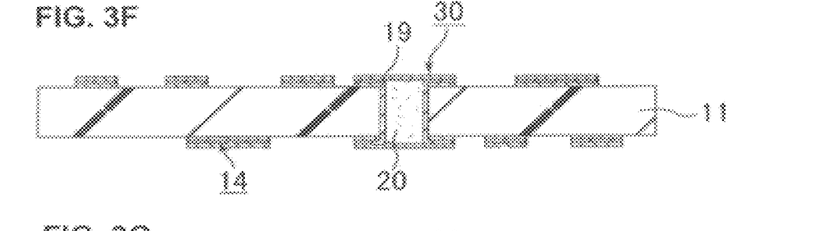

(4) Next, as shown in FIG. 3E, conductive layers 21 made of electroless copper-plated film and electrolytic copper-plated film were formed on electrolytic copper-plated film and resin-filler layer 20. Next, as shown in FIG. 3F, conductive circuits 14 were formed on insulative substrate 11 using a subtractive method. Simultaneously, conductive circuits 30 covering resin-filler layer 20 were formed.

Figure 3G:
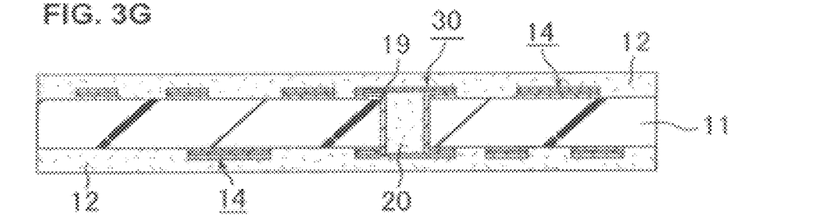

(5) Next, as shown in FIG. 3G, interlayer resin insulation layers 12 were formed on insulative substrate 11 and conductive circuits 14 using a film for interlayer resin insulation layers (ABF made by Ajinomoto). Namely, the film for interlayer resin insulation layers was laminated on the substrate under the conditions of vacuum degree of 65 Pa, pressure of 0.4 MPa, temperature of 80° C. and time of 60 seconds, and then thermoset at 170° C. for 30 minutes.

Figure 4A:
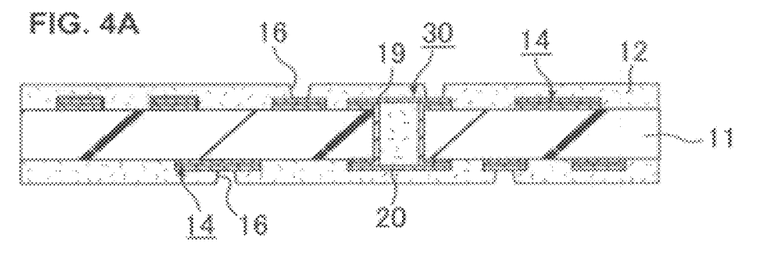
FIG. 4A, FIG. 4B, FIG. 4C and FIG. 4D are cross-sectional views schematically showing a method for manufacturing a printed wiring board according to the embodiment.

(6) Next, opening portions 16 with a diameter of 60 μm were formed in interlayer resin insulation layers 12 using a $CO_2$ gas laser (see FIG. 4A).

Figure 4B:
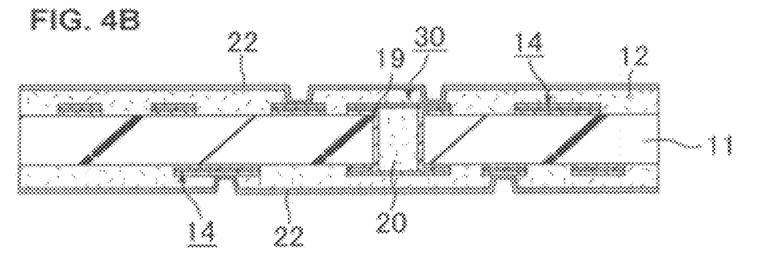

(7) Next, a palladium catalyst (not shown in the drawings) was attached to the surfaces of interlayer resin insulation layers 12 (including inner-wall surfaces of opening portions 16). Then, the substrate with the palladium catalyst was immersed in an electroless copper plating solution containing sodium hypophosphite as a reduction agent (MF-390 made by Japan MacDermid) to form electroless copper-plated films 22 with a thickness of 0.1~0.3 μm on the surfaces of interlayer resin insulation layers 12 (including inner-wall surfaces of opening portions 16) (see FIG. 4B). The conditions for electroless copper plating were a solution temperature of 75° C. for four minutes.

Figure 4C:
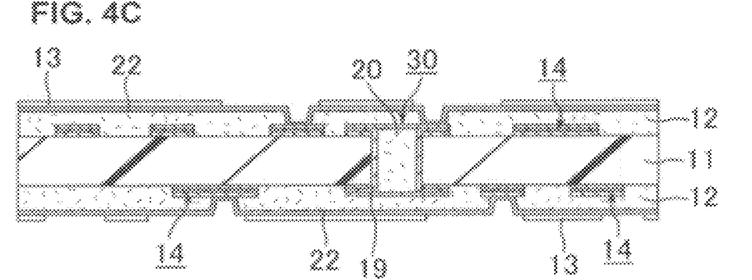

(8) Next, a commercially available photosensitive dry film was laminated on electroless copper-plated films 22, on which a mask was placed, and then exposure and development were conducted. Accordingly, plating resist 13 with a thickness of 25 μm was formed (see FIG. 4C).

Figure 4D:
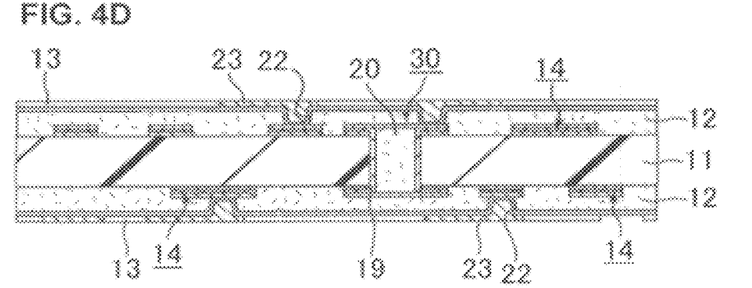

(9) Next, after the substrate with plating resist 13 was degreased by washing it with 50° C. water, washed with 25° C. water, and further cleansed with sulfuric acid, electrolytic plating was performed. Accordingly, electrolytic copper-plated film 23 with a thickness of 20 μm was formed at portions where plating resist 13 was not formed (see FIG. 4D).

Figure 5A:
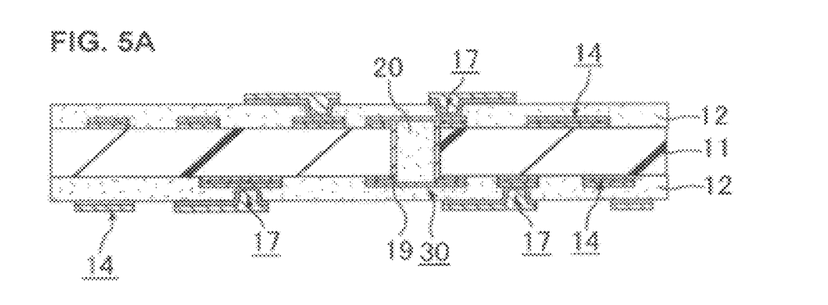
FIG. 5A, FIG. 5B, FIG. 5C and FIG. 5D are cross-sectional views schematically showing a method for manufacturing a printed wiring board according to the embodiment.
Figure 5B:
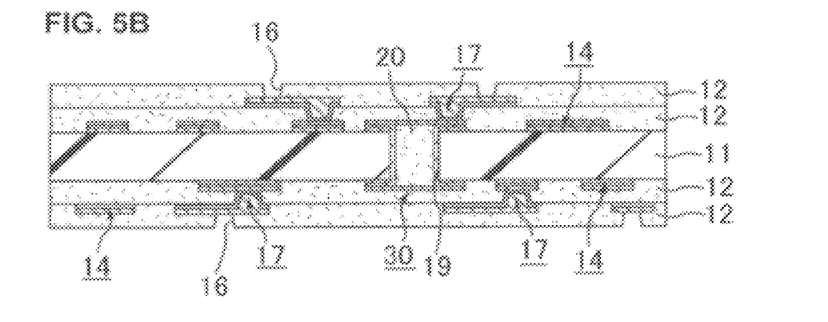
Figure 5C:
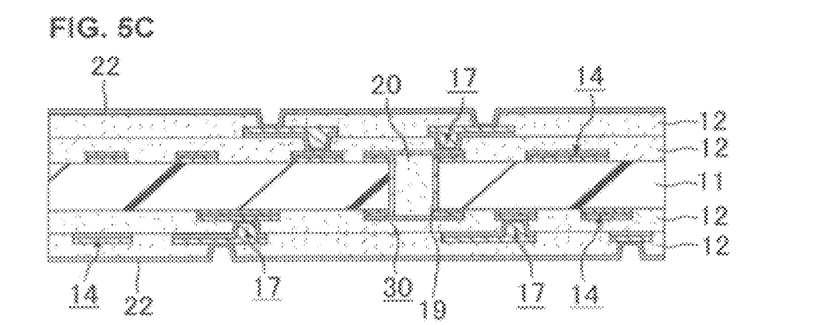
Figure 5D:
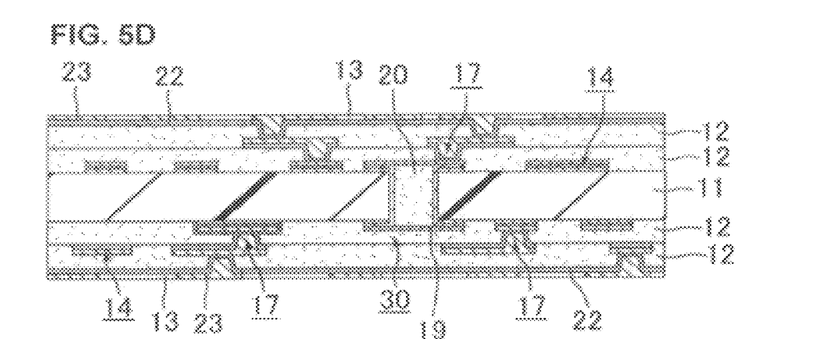

(10) Next, plating resist 13 was removed. Then, electroless copper-plated film 22 between adjacent electrolytic copper-plated films were dissolved and etched away using a mixed solution of sulfuric acid and hydrogen peroxide. Accordingly, 18 μm-thick conductive circuits 14 and via conductors 17 were formed, being made of electroless copper-plated film 22 and electrolytic copper-plated film 23 on the electroless copper-plated film (see FIG. 5A).

(11) Next, using a method the same as above steps (5) through (10), interlayer resin insulation layers 12 and conductive circuits 14 (including via conductors 17) were formed (see FIGS. 5B~6A). Portions of the conductive circuits formed here become solder pads 34 in a later step.

(12) Next, the substrate having outermost conductive circuits (14*a*) (including solder pads 34) was immersed in a 10% sulfuric acid solution for 10 seconds, washed with water, and dried through an air-cut method (i.e., under a heated atmosphere).

(13) Next, after the substrate was immersed under the conditions of 30° C. for 30 seconds in a tin displacement solution which contains 0.1 mol/L tin fluoroborate and 1 mol/L thiourea and whose pH was adjusted to be approximately 1.2 using fluoroboric acid, the substrate was washed with water for 30 seconds and dried through an air-cut method (i.e., under a heated atmosphere). Through such a plating process, an SnCu layer and an Sn layer were formed in that order on the surfaces of outermost conductive circuits (14*a*) (including solder pads 34). The thickness of the SnCu layer was approximately 5~10 nm, and the thickness of the Sn layer was approximately 50 nm.

(14) Next, the substrate was immersed for 10 seconds in a 1% nitric acid solution, and washed with water for 20 seconds. Accordingly, the Sn layer was removed and the SnCu layer was exposed.

Figure 6A:
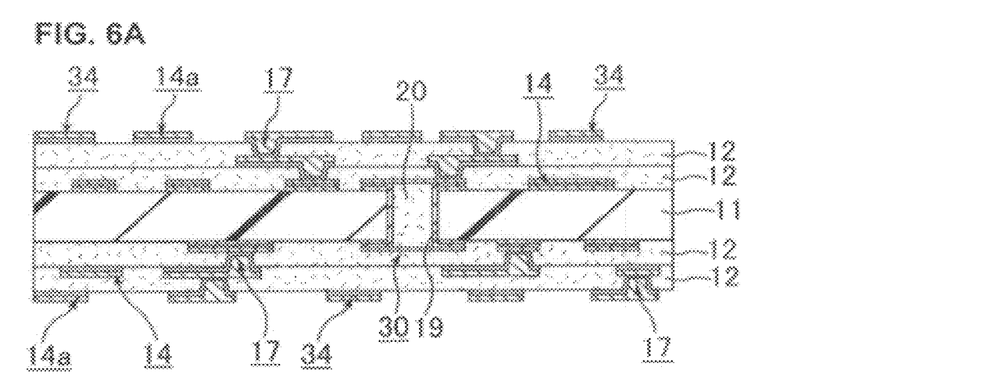
FIG. 6A, FIG. 6B and FIG. 6C are cross-sectional views schematically showing a method for manufacturing a printed wiring board according to the embodiment.
Figure 6B:
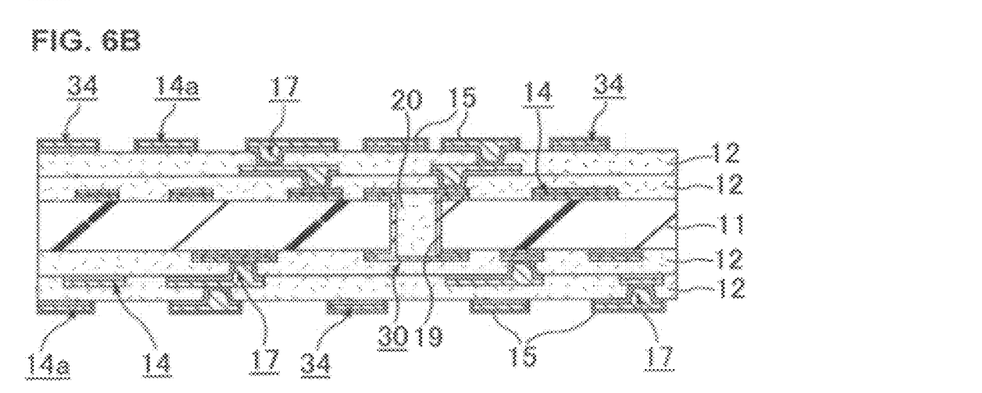

(15) Next, a γ-aminopropyltriethoxysilane solution (KBE-903 made by Shin-Etsu Chemical) whose concentration was adjusted to be 1 wt. % was sprayed on outermost conductive circuits (14*a*) (on the SnCu layer). Then, after the substrate was dried at 90~120° C. for 30~150 seconds, the substrate was washed with water to remove excess silane coupling agent. By conducting above steps (12) through (15), adhesive layer 15 made of a metal layer containing Sn and of a silane coupling agent was formed on outermost conductive circuits (14*a*) (including solder pads 34) (see FIG. 6B).

Figure 6C:
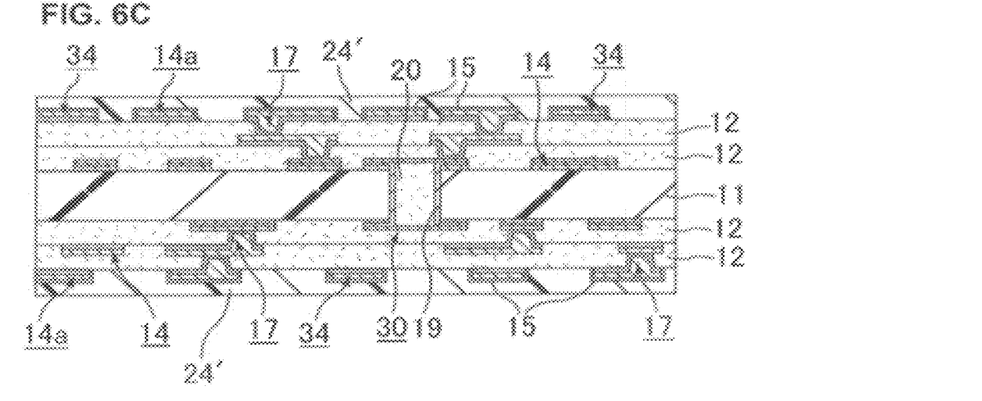

(16) Next, as shown in FIG. 6C, a solder-resist composition, which contains inorganic filler (such as silica and barium sulfate) with an average particle diameter of 1 μm or smaller at 10~15 wt. % and which does not contain organic filler, was applied on the outermost layers to be 30 μm thick, and was dried under the conditions of 70° C. for 20 minutes and 70° C. for 30 minutes. Accordingly, layers (24') of solder-resist composition were formed.

Figure 7A:
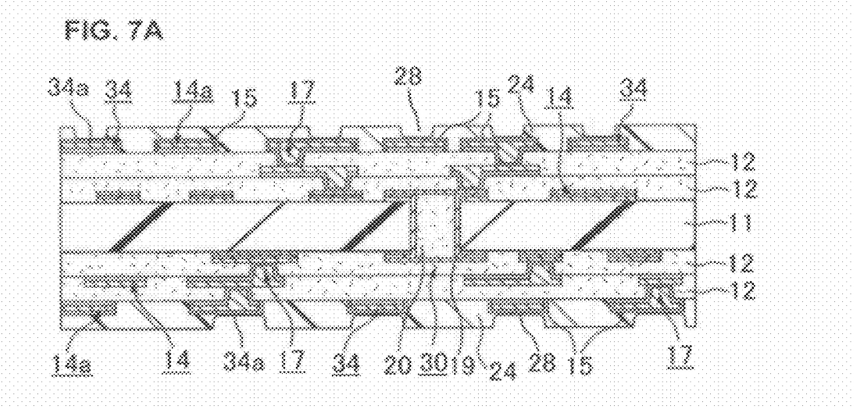
FIG. 7A and FIG. 7B are cross-sectional views schematically showing a method for manufacturing a printed wiring board according to the embodiment.

(17) Next, a 5 mm-thick photomask with a pattern of opening portions was adhered to layers (24') of the solder-resist composition, which were then exposed to ultraviolet rays at 100 mJ/cm² and developed with a DMTG solution. Accordingly, opening portions 28 were formed as shown in FIG. 7A. Furthermore, layers (24') of the solder-resist composition were cured through thermal treatment under the conditions of 80° C. for an hour, 100° C. for an hour, 120° C. for an hour and 150° C. for three hours to form solder-resist layers 24 (20 μm thick) having openings 28.

(18) Next, an etching solution containing 15~20 wt. % nitric acid solution and a 1~2 wt. % hydrogen peroxide solution was sprayed in opening portions 28. Accordingly, the second layer made of a silane coupling agent and the SnCu layer (first layer) were removed along with the resin residue in opening portions 28. As a result, portions of electrolytic copper-plated film 23 that form solder pads 34 were exposed (exposed surfaces 34a) at the bottoms of opening portions 28.

In addition, after step (18) was completed, the bottom of an opening portion was observed using an SEM and elements of the exposed surface were analyzed, but no Sn peaks were detected. Therefore, it is thought that the SnCu layer was completely removed by the above treatment using an etching solution.

(19) Next, the substrate with solder-resist layers 24 was immersed for 20 minutes in an electroless nickel plating solution of pH=4.5 containing nickel chloride ($2.3 \times 10^{-3}$ mol/L), sodium hypophosphite ($2.8 \times 10^{-1}$ mol/L) and sodium citrate ($1.6 \times 10^{-1}$ mol/L) to form 5 μm-thick nickel-plated layer 31 in opening portions 28.

(20) After step (19) was completed, a portion containing opening portion (28) and solder pad 34 was separated and its cross section was photographed for observation using an SEM. As shown in FIG. 2C, the photograph of the cross section showed that solder-resist layer 24 had protruding portion 26 which is shaped to protrude at the bottom of opening portion 28 toward the inside of opening portion 28, and protruding portion 26 had flat surface 25 at its end.

(21) Next, the substrate was immersed under the conditions of 80° C. for 7.5 minutes in an electroless gold plating solution containing gold potassium cyanide ($7.6 \times 10^{-3}$ mol/L), ammonium chloride ($1.9 \times 10^{-1}$ mol/L), sodium citrate ($1.2 \times 10^{-1}$ mol/L) and sodium hypophosphite ($1.7 \times 10^{-1}$ mol/L) to form a 0.03 μm-thick gold plated layer on the nickel plated layer. Accordingly, coating layer 33 was formed, being made up of those two layers.

Figure 7B:
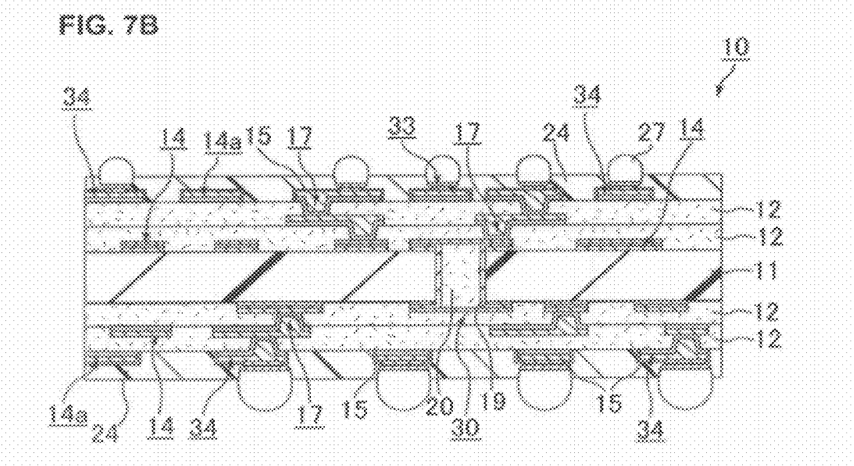

(22) Next, solder paste was printed on opening portions 28 formed in solder-resist layers 24 and solder bumps 27 were formed by a reflow at 200° C. Accordingly, printed wiring board 10 was completed (see FIG. 7B).

COMPARATIVE EXAMPLE

Figure 8A:
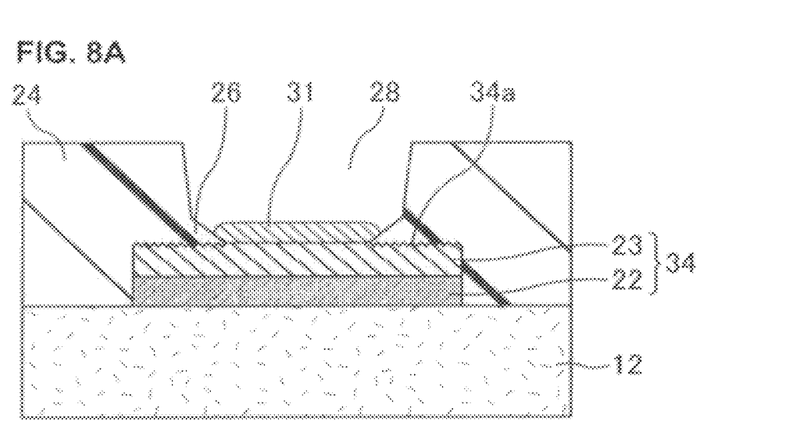
FIG. 8A is a cross-sectional view schematically showing the surroundings of an opening portion when a solder-resist layer is formed on a pad whose surface is roughened.
Figure 8B:
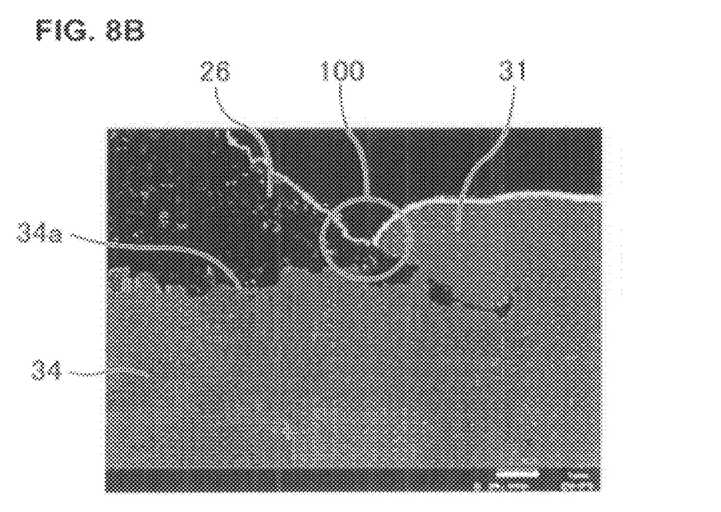
FIG. 8B is a photograph of a cross section observed in the surroundings of an opening portion when a solder-resist layer is formed on a pad whose surface is roughened.

A printed wiring board was manufactured through the same procedure as in the example except for the following. After completing steps through (11), a sand blasting treatment was performed on the substrate having solder pads 34 to roughen the surfaces of solder pads 34. Steps (12) through (15) and (18) (steps for forming an adhesive layer and an etching step for the adhesive layer) were not conducted. A commercially available solder-resist composition (SR 7200 made by Hitachi Chemical) was used as the solder-resist composition used in step (16). Compared with the solder-resist composition used in the above example, the amount of inorganic filler contained in the solder-resist composition is greater, approximately 30 wt. %, and its average particle diameter is also greater. Moreover, the solder-resist composition used in the comparative example contains organic filler. The same as in the example, a portion containing an opening portion and a solder pad was separated after the completion of step (19), and its cross section was photographed for observation using an SEM. A schematic view is shown in FIG. 8A and the photograph is shown in FIG. 8B. FIG. 8A is a cross-sectional view schematically showing the surroundings of an opening portion when a solder-resist layer was formed on a pad having a roughened surface. FIG. 8B is a photograph of a cross section observed in the surroundings of a protruding portion when a solder-resist layer was formed on a pad having a roughened surface.

In FIG. 8A, solder pad 34 is formed on interlayer resin insulation layer 12. Solder pad 34 is made up of electroless copper-plated film 22 and electrolytic copper-plated film 23 on electroless copper-plated film 22. Roughened surface (34a) is formed on solder pad 34, and solder-resist layer 24 is formed on roughened surface (34a). Opening portion 28 is formed in solder-resist layer 24, and coating layer 31 made of a metal layer such as Ni and the like is formed at the bottom of opening portion 28. Solder-resist layer 24 has protruding portion 26 which protrudes at the bottom of opening portion 28 toward the inside of opening portion 28. In the photograph shown in FIG. 8B, the end of protruding portion 26 was covered with coating layer 31, and recess 100 (the encircled region) was formed by protruding portion 26 and coating layer 31.

Evaluation of Printed Siring Boards of the Example and the Comparative Example

In a printed wiring board of the comparative example, a recess is formed because part of a protruding portion having a relatively steep inclination is covered by a coating layer. When forming a solder bump, voids tend to remain in such a recess, and may result in lowered adhesiveness and reliability in the solder bump.

By contrast, in a printed wiring board of the example, since part of a substantially flat protruding portion is covered by a coating layer, a relatively shallow recess is formed and voids seldom remain when a solder bump is formed. As a result, adhesiveness and reliability of the solder bump are easily ensured in the example.

OTHER EMBODIMENTS

In the above embodiment, a metal layer containing Sn is used as the metal layer (first layer) to be formed on side surfaces and part of the top surface of a solder pad. However, in a printed wiring board according to the embodiment of the present invention, the material for the metal layer is not limited to a metal layer containing Sn. It is sufficient if a metal layer contains at least one of Sn, Ni, Zn, Co, Ti, Pd, Ag, Pt and Au, since the adhesiveness of such metals with a coupling agent is better than that of Cu. However, as described previously, a metal layer containing Sn is preferred among those, because a hydroxyl group is easily attached to its surface and adhesiveness with a coupling agent is especially excellent.

Also, in the embodiment described above, a silane coupling agent is used as the coupling agent to form the second layer. However, in a printed wiring board according to the embodiment of the present invention, it is not limited to silane coupling agents, and other coupling agents, for example, aluminate coupling agents, titanate coupling agents, zirconate coupling agents or the like, may also be used.

Furthermore, the above silane coupling agent is selected considering the material of the solder-resist layer. For example, if a resin composition containing epoxy resin is used as the solder-resist composition, it is preferred to select a silane coupling agent having an amino group as an organic functional group, because the solder-resist layer and the silane coupling agent tend to bond firmly in such a combination.

Also, instead of a coating film formed with a first layer made of metal containing Sn and a second layer made of a silane coupling agent, a thiol silane film may be used. In such a case, an adhesive layer is formed after thiol silane is applied on side and top surfaces of solder pads, solder-resist layers are formed and opening portions are formed, then thiol silane exposed at the bottoms of the opening portions is removed by irradiating a 172 nm-UV laser.

As for a solder-resist composition, for example, the following are listed: solder-resist compositions made of polyphenylene ether resin, polyolefin resin, fluororesin, thermoplastic elastomer, epoxy resin, polyimide resin and the like. In addition, as for solder-resist compositions other than the above, for example, the following may be listed: novolac-type epoxy resin (meth)acrylate, imidazole curing agents, bifunctional (meth)acrylic acid ester monomers, (meth)acrylic acid ester polymers of approximately 500~5,000 molecular weight, thermosetting resins made of bisphenol-type epoxy resin or the like, photosensitive monomers such as multifunctional acrylic monomers, paste-type fluids containing glycol ether solvents and the like. When forming a layer of solder-resist composition, such a layer may be formed by pressing film made of a solder-resist composition such as above.

In the above embodiment, an etching solution containing a nitric acid solution and a hydrogen peroxide solution is used as an etching solution to remove the adhesive layer and to expose solder pads at the bottoms of the opening portions formed in solder-resist layers. However, other etching solutions such as a permanganic acid solution or the like may also be used.

In the above-described embodiment, a coating layer with two layers of an Ni layer and an Au layer is formed. However, the total number of layers forming the coating layer is not limited to two layers, and it may be a single layer or three or more layers. Also, the coating layer may be formed by plating Ni, Pd and Au in that order.

In addition, when opening portions are formed in solder-resist layers through a laser process, lasers such as a carbon-dioxide gas laser, an ultraviolet laser and an excimer laser may be used for such a laser process. Also, through-hole conductors containing a resin-filler layer are employed in the above embodiment; however, through-hole conductors may be formed only with plating.

A printed wiring board according to an embodiment of the present invention is characterized by the following: an interlayer resin insulation layer; a pad formed on the interlayer resin insulation layer and for mounting an electronic component; a solder-resist layer formed on the interlayer resin insulation layer and on the pad and having an opening portion on the pad; and a coating layer formed on the pad that is exposed through the opening portion. In such a printed wiring board, the solder-resist layer has a protruding portion that is shaped to protrude at the bottom of an opening portion toward the inside of the opening portion, and the protruding portion has a flat surface at its end.

In the printed wiring board, the solder-resist layer has a protruding portion that is shaped to protrude at the bottom of an opening portion toward the inside of the opening portion, and the protruding portion has a flat surface at its end. Therefore, a recess is most likely suppressed from being formed because of such a protruding portion and the coating layer. Since voids do not remain in the opening portion when a bump is formed, the adhesiveness of the bump is improved and reliability is considered to be enhanced.

In the printed wiring board, at least part of the flat surface may be covered with the coating layer. In addition, in the printed wiring board, at least part of the flat surface may be embedded under the coating layer. In such a structure, the end of a protruding portion in the solder-resist layer is vertically sandwiched by the coating layer and a pad. Accordingly, the adhesiveness of the solder-resist layer (protruding portion) to the pad is improved.

In the printed wiring board, the solder-resist layer may contain inorganic filler at 5~25 wt. %. In the printed wiring board, the solder-resist layer may contain inorganic filler with an average particle diameter of 1 μm or smaller. In the printed wiring board, the solder-resist layer may not contain organic filler. If a solder-resist layer containing a small amount of filler with a fine diameter is used, there are fewer obstacles during exposure to light and the effects of the light reflected at pads tend to be greater. Then, if opening portions are formed in such a solder-resist layer through exposure and development, they are preferable since flat surfaces tend to be formed at the ends of the protruding portions.

In the printed wiring board, the thickness of the solder-resist layer may be 10~20 μm.

In the printed wiring board, the diameter of the opening portions formed in the solder-resist layer may be 45~60 μm. When the diameter of an opening portion is of such a small value, if a recess is formed at the bottom of the opening portion, then voids tend to occur at the bottom of a bump. Therefore, it is especially effective if a flat surface is formed.

In the printed wiring board, the surface roughness (Ra) of the pads may be 0.3 μm or less. If the surface roughness is in such a low range, flat surfaces tend to be formed at the ends of protruding portions when a solder-resist layer is formed. In addition, when a signal with a high frequency that exceeds 1 GHz is transmitted, transmission loss caused by the skin effect is prevented from increasing.

In the printed wiring board, an adhesive layer may be formed between the pads and the solder-resist layer. In the printed wiring board, the adhesive layer may have a first layer containing Sn and a second layer formed on the first layer and made of a coupling agent. In the printed wiring board, the first layer may contain Sn and Cu. It is preferable for an adhesive layer to be formed with such a structure, since adhesiveness is enhanced between the pads and the solder-resist layer.

In the printed wiring board, the pads may be made of electroless plated film on the interlayer resin insulation layer and of electrolytic plated film formed on the electroless plated film.

In the printed wiring board, the coating layer may have a surface which is recessed in its central portion from its peripheral portion. If the central portion of the coating layer is recessed, when a solder ball is loaded in an opening portion while forming a bump, the ball tends to be aligned in the center of the coating layer.

Also, the method for manufacturing a printed wiring board according to an embodiment of the present invention is characterized by the following: preparing an interlayer resin insulation layer; on the interlayer resin insulation layer, forming a pad for mounting an electronic component; forming a solder-resist layer on the interlayer resin insulation layer and on the pad; in the solder-resist layer, forming an opening portion that exposes at least part of the pad; and forming a coating layer on the pad that is exposed through the opening portion. When forming the opening portion, a protruding portion is formed to protrude at the bottom of the opening portion toward the inside of the opening portion and to have a flat surface at its end.

In the method for manufacturing a printed wiring board, at least part of the flat surface of a protruding portion may be covered by the coating layer.

In the method for manufacturing a printed wiring board, an adhesive layer may be formed on the pads, and the solder-resist layer may be formed to cover the pads and the adhesive layer. By forming an adhesive layer, a printed wiring board is manufactured where adhesiveness is enhanced between the pads and the solder-resist layer.

In the method for manufacturing a printed wiring board, the adhesive layer exposed through the opening portions formed in the solder-resist layer may be removed. By removing the adhesive layer, a coating layer to be formed later is formed directly on the pads, and a printed wiring board is manufactured having a smaller electrical resistance between the coating layer and the pads.

In the method for manufacturing a printed wiring board, the solder-resist layer may contain inorganic filler at 5~25 wt. % and may not contain organic filler. In addition, in the method for manufacturing a printed wiring board, the solder-resist layer may contain inorganic filler with an average particle diameter of 1 μm or smaller. If the particle diameter of a filler contained in the solder-resist layer is fine and the amount of the filler is small, there are fewer obstacles during exposure to light and the effects of the light reflected at pads tend to be greater. It is preferable for openings to be formed in such a solder-resist layer through exposure and development, since flat surfaces tend to be formed at the ends of protruding portions.

Obviously, numerous modifications and variations of the present invention are possible in light of the above teachings. It is therefore to be understood that within the scope of the appended claims, the invention may be practiced otherwise than as specifically described herein.

What is claimed is:

1. A printed wiring board, comprising:
   an interlayer resin insulation layer;
   a pad formed on the interlayer resin insulation layer and configured to mount an electronic component;
   a solder-resist layer formed on the interlayer resin insulation layer and the pad and having an opening portion over the pad such that the opening portion of the solder-resist layer is exposing a portion of a surface of the pad;
   an adhesive layer formed between the pad and the solder-resist layer; and
   a coating layer formed in the opening portion of the solder-resist layer such that the coating layer is positioned on the portion of the pad exposed through the opening portion of the solder-resist layer,
   wherein the solder-resist layer has a protruding portion protruding toward an inside of the opening portion in a bottom portion of the opening portion, and the protruding portion of the solder-resist layer has an end portion having a flat surface such that the flat surface is extending substantially along the surface of the pad.

2. The printed wiring board according to claim 1, wherein the flat surface of the protruding portion is covered with the coating layer.

3. The printed wiring board according to claim 1, wherein the flat surface of the protruding portion is embedded under the coating layer.

4. The printed wiring board according to claim 1, wherein the solder-resist layer includes an inorganic filler in an amount of 5~25 wt. %.

5. The printed wiring board according to claim 1, wherein the solder-resist layer includes an inorganic filler having an average particle diameter of 1 μm or smaller.

6. The printed wiring board according to claim 1, wherein the solder-resist layer does not contain an organic filler.

7. The printed wiring board according to claim 1, wherein the solder-resist layer has a thickness which is set to be in a range of 10~20 μm.

8. The printed wiring board according to claim 1, wherein the opening portion of the solder-resist layer has a diameter which is set to be in a range of 45~60 μm.

9. The printed wiring board according to claim 1, wherein the pad has a surface roughness which is set to be in a range of 0.3 μm or less.

10. The printed wiring board according to claim 1, wherein the adhesive layer has a first layer comprising Sn and a second layer formed on the first layer and comprising a coupling agent.

11. The printed wiring board according to claim 10, wherein the first layer comprises Sn and Cu.

12. The printed wiring board according to claim 1, wherein the pad comprises an electroless plated film on the interlayer resin insulation layer and an electrolytic plated film formed on the electroless plated film.

13. The printed wiring board according to claim 1, wherein the coating layer has a surface having a recessed portion at a central portion of the surface of the coating layer.

14. A method for manufacturing a printed wiring board, comprising:
   forming on an interlayer resin insulation layer a pad configured to mount an electronic component;
   forming an adhesive layer on the pad;
   forming a solder-resist layer on the interlayer resin insulation layer and the pad formed on the interlayer resin insulation layer such that the solder-resist layer covers the pad and the adhesive layer and the adhesive layer is formed between the pad and the solder-resist layer;
   forming an opening portion in the solder-resist layer such that the opening portion of the solder-resist layer exposes at least a portion of the adhesive layer formed on the pad;
   removing the portion of the adhesive layer exposed through the opening portion in the solder-resist layer such that the opening portion of the solder-resist layer exposes at least a portion of a surface of the pad; and
   forming a coating layer in the opening portion of the solder-resist layer such that the coating layer is positioned on the portion of the pad exposed through the opening portion of the solder-resist layer,
   wherein the forming of the opening portion of the solder-resist layer comprises forming in the solder-resist layer a protruding portion protruding toward an inside of the opening portion in a bottom portion of the opening portion such that the protruding portion of the solder-resist layer has an end portion having a flat surface extending substantially along the surface of the pad.

15. The method for manufacturing a printed wiring board according to claim 14, wherein the forming of the protruding portion comprises forming the flat surface of the protruding portion such that the coating layer is covered by the flat surface of the protruding portion.

16. The method for manufacturing a printed wiring board according to claim 15, wherein the solder-resist layer includes an inorganic filler in an amount in a range of 5~25 wt. % and does not contain an organic filler.

17. The method for manufacturing a printed wiring board according to claim 14, wherein the solder-resist layer includes an inorganic filler having an average particle diameter of 1 μm or smaller.

18. The method for manufacturing a printed wiring board according to claim 14, wherein the adhesive layer has a first layer comprising Sn and a second layer formed on the first layer and comprising a coupling agent.

19. The method for manufacturing a printed wiring board according to claim 18, wherein the first layer comprises Sn and Cu.

20. The method for manufacturing a printed wiring board according to claim 14, wherein the forming of the pad comprises forming an electroless plated film on the interlayer resin insulation layer and forming an electrolytic plated film formed on the electroless plated film such that the pad comprising the electroless plated film and the electrolytic plated film is formed on the interlayer resin insulation layer.

* * * * *